(12) United States Patent
Nakamura et al.

(10) Patent No.: US 10,844,474 B2
(45) Date of Patent: Nov. 24, 2020

(54) CATHODE UNIT FOR SPUTTERING APPARATUS

(71) Applicant: ULVAC, INC., Kanagawa (JP)

(72) Inventors: Shinya Nakamura, Kanagawa (JP); Yukihito Tashiro, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 85 days.

(21) Appl. No.: 16/326,760

(22) PCT Filed: Mar. 6, 2018

(86) PCT No.: PCT/JP2018/008619
§ 371 (c)(1),
(2) Date: Feb. 20, 2019

(87) PCT Pub. No.: WO2019/021519
PCT Pub. Date: Jan. 31, 2019

(65) Prior Publication Data
US 2019/0194798 A1  Jun. 27, 2019

(30) Foreign Application Priority Data

Jul. 25, 2017  (JP) .................................. 2017-143364

(51) Int. Cl.
*C23C 14/35* (2006.01)
*C23C 14/34* (2006.01)
(Continued)

(52) U.S. Cl.
CPC .......... *C23C 14/3407* (2013.01); *C23C 14/35* (2013.01); *C23C 14/351* (2013.01);
(Continued)

(58) Field of Classification Search
CPC . H01J 37/3435; H01J 37/345; C23C 14/3407; C23C 14/35; C23C 14/351; C23C 14/505; C23C 14/56
(Continued)

(56) References Cited

U.S. PATENT DOCUMENTS 5,292,419 A * 3/1994 Moses .................. C23C 14/566
204/298.06

FOREIGN PATENT DOCUMENTS

JP  58-128976 U  9/1983
JP  62-10270 A  1/1987
(Continued)

OTHER PUBLICATIONS

International Search Report and Written Opinion for PCT Patent App. No. PCT/JP2018/008619 (dated Apr. 17, 2018) with English translation of the ISR.

*Primary Examiner* — Rodney G McDonald
(74) *Attorney, Agent, or Firm* — Cermak Nakajima & McGowan LLP; Tomoko Nakajima

(57) ABSTRACT

There is provided a cathode unit for a sputtering apparatus, having a construction in which a target can be replaced without opening a vacuum chamber to the atmosphere. The cathode unit having targets and being adapted to be mounted on a vacuum chamber has: a supporting frame mounted on an external wall of the vacuum chamber; an annular moveable base supported by the supporting frame in a manner to be movable toward or away from the vacuum chamber; a rotary shaft body rotatably supported by the movable base in a manner to be elongated through an inner space of the movable base in parallel with a sputtering surface of the target; provided an axial direction of the rotary shaft body is defined to be an X-axis direction, and a forward or backward
(Continued)

direction orthogonal to the X-axis direction of the movable base is defined to be a Z-axis direction.

4 Claims, 3 Drawing Sheets

(51) Int. Cl.
    *H01J 37/34*         (2006.01)
    *C23C 14/50*         (2006.01)
    *C23C 14/56*         (2006.01)

(52) U.S. Cl.
    CPC ............ *C23C 14/505* (2013.01); *C23C 14/56* (2013.01); *H01J 37/345* (2013.01); *H01J 37/3435* (2013.01)

(58) Field of Classification Search
    USPC .......................... 204/298.23, 298.27, 298.28
    See application file for complete search history.

(56) References Cited

FOREIGN PATENT DOCUMENTS

| | | |
|---|---|---|
| JP | 10-147863 A | 6/1998 |
| JP | 2013-171941 A | 9/2013 |
| JP | 2014-091861 A | 5/2014 |

\* cited by examiner

CATHODE UNIT FOR SPUTTERING APPARATUS

This application is a national phase entry under 35 U.S.C. § 371 of PCT Patent Application No. PCT/JP2018/008619, filed on Mar. 6, 2018, which claims priority under 35 U.S.C. § 119 to Japanese Patent Application No. 2017-143364, filed Jul. 25, 2017, both of which are incorporated by reference.

TECHNICAL FIELD

The present invention relates to a cathode unit for use in a sputtering apparatus, the cathode unit having a target and being adapted to be mounted on a vacuum chamber.

BACKGROUND ART

As one of the methods for forming a predetermined thin film on a substrate to be processed inside a vacuum atmosphere, there is conventionally known one in which a sputtering apparatus is used. This kind of sputtering apparatus is ordinarily provided with a vacuum chamber. In an upper portion of the vacuum chamber there is detachably mounted a cathode unit provided with a target that is manufactured depending on the composition of the film to be formed. Further, in a lower portion of the vacuum chamber there is provided a stage on which is mounted a substrate such as a silicon wafer, glass substrate, and the like in a manner to lie opposite to the target. Then, in a state in which the cathode unit is mounted, the vacuum chamber is evacuated to a predetermined pressure and thereafter a sputtering gas (such as argon gas and the like) is introduced into the vacuum chamber in a predetermined flow amount. By supplying to the target a predetermined power, e.g., with negative electric potential, the target gets sputtered. The sputtered particles thus scattered from the target get adhered and deposited on the surface of the substrate on the stage, thereby forming a predetermined thin film (see, for example, patent document 1).

By the way, when the target is sputtered as described above, the target gets eroded and, therefore, it is necessary to replace the target periodically. In replacing the target, it is normal practice to follow the following procedures, i.e.: the film-forming processing using the sputtering apparatus is once stopped; after having returned the vacuum chamber back to the atmospheric pressure, the cathode unit is dismounted from the vacuum chamber; and in this state the work of replacing the target is carried out. Now, once the vacuum chamber is returned to the atmospheric pressure, an internal wall surface and the like of the vacuum chamber will have adhered thereto molecules of water and the like that are hardly evacuated. Such being the case, after having replaced the target, when the cathode unit is mounted again in the vacuum chamber, and the inside of the vacuum chamber is evacuated once again, it will take much time, depending on the volume of the vacuum chamber, to evacuate the vacuum chamber to a predetermined pressure in order to eliminate adverse effects on the film formation on the substrate. Therefore, there is a problem in that the time of suspending the film-forming processing becomes long accompanied by the replacement of the target. In view of the above, it is desired to develop a cathode unit which is capable of replacing the target without opening the vacuum chamber to the atmosphere.

PRIOR ART DOCUMENT

Patent Document

Patent Document 1: JP-2014-91861 A

SUMMARY OF THE INVENTION

Problems that the Invention is to Solve

In view of the above point, this invention has an object of providing a cathode unit for use in a sputtering apparatus, the cathode unit having a construction in which the targets can be replaced without opening the vacuum chamber to the atmosphere.

Means of Solving the Problems

In order to solve the above-mentioned problem, the cathode unit for use in a sputtering apparatus in which the cathode unit has a target and is adapted to be mounted on a vacuum chamber comprises: a supporting frame mounted on an external wall of the vacuum chamber; an annular moveable base supported by the supporting frame in a manner to be moveable toward or away from the vacuum chamber; a rotary shaft body rotatably supported by the movable base in a manner to be elongated through an inner space of the movable base in parallel with a sputtering surface of the target. Provided an axial direction of the rotary shaft body is defined to be an X-axis direction, and a forward or backward direction of the movable base orthogonal to the X-axis direction is defined to be a Z-axis direction, the cathode unit comprises at least one target holder disposed on the rotary shaft body in a manner to be radially protruded such that the target is detachably mounted in position on a tip surface of the target holder; a reserve chamber disposed in that portion of the supporting frame which is away by a predetermined distance in the Z-axis direction from an external wall surface of the vacuum chamber, the reserve chamber having an open-close door and being capable of evacuation independent of the vacuum chamber; a pair of vacuum bellows disposed between the movable base and the reserve chamber, and between the movable base and the vacuum chamber so as to enclose the target holder. The target holder is provided with an isolating part which: comes into close contact with a peripheral part of a first opening formed in the vacuum chamber such that the vacuum chamber in which the target is present is isolated in a film-forming position of the movable base in which the target holder is positioned on the Z axis and the target has been moved in the Z-axis direction closer to the vacuum chamber in a posture to face the vacuum chamber side, the target holder being provided with the isolating part which comes into close contact with a peripheral part of a second opening formed in the reserve chamber in a replacing position of the movable base in which the target has been moved in the Z-axis direction away from the vacuum chamber in a posture to face the reserve chamber side. The isolating part is further provided with a rotary mechanism for rotating the rotary shaft body about the X-axis in a neutral position of the movable base in which the isolating part is away from the first opening and the second opening.

According to this invention, prior to mounting in position the cathode unit on the external wall of the vacuum chamber, a target is mounted on the tip surface of the target holder and arrange such that the target holder assumes the posture in which the target holder is positioned on the Z-axis line and also in which the target faces the vacuum chamber side. In this case, the movable base is supposed to be in the neutral position and the open-close door to the reserve chamber under the atmospheric pressure is supposed to be closed. Then, the cathode unit is mounted on a predetermined position of the vacuum chamber through the supporting frame. When the cathode unit has been mounted, the vacuum pump is operated to evacuate the vacuum chamber and the reserve chamber. The vacuum chamber and the reserve chamber may be evacuated by a single vacuum pump or may be independently evacuated by separate pumps. Accompanied by the evacuation of the vacuum chamber and the reserve chamber, the inner space of the pair of vacuum bellows inclusive of the inner space of the movable base are simultaneously evacuated through the first opening and the second opening.

When the vacuum chamber and the reserve chamber have been evacuated to the predetermined pressure, the movable base is moved in the Z-axis direction closer to the vacuum chamber. Once the movable base has reached the film-forming position, the inside of the vacuum chamber is isolated by the isolating part of the target holder, in a state in which the target mounted on the target holder is present inside the vacuum chamber. It thus becomes possible for the film-forming operation to be carried out by sputtering the target. Then, when the target has got eroded by a predetermined amount as a result of sputtering of the target, the target will be replaced.

In replacing the target, the movable base is returned to the neutral position, and the rotary shaft body is rotated by 180° about the X axis by means of the rotary mechanism. Then, the used target that was mounted on the target holder will be in a posture to face the reserve chamber side. Thereafter, the movable base is moved in the Z-axis direction so as to be away from the vacuum chamber and, when the movable base has reached the replacing position, the inside of the reserve chamber will be isolated by the isolating part of the target holder in a state in which the target mounted on the target holder is present inside the reserve chamber. Then, by introducing nitrogen gas, air, and the like into the reserve chamber, the reserve chamber is returned back to the atmospheric pressure. By opening the open-close door, the used target is capable of being replaced.

After the target has been replaced, the open-close door is closed and then the reserve chamber is evacuated to a predetermined pressure. When the reserve chamber has reached the predetermined pressure, the movable base is moved closer to the vacuum chamber in the Z-axis direction. Once the movable base has reached the neutral position, the movable base is rotated once again by, e.g., 180° about the X axis. Then, an unused target mounted on the target holder will be in a posture to face the vacuum chamber side. By moving the movable base to the film-forming position, there will be attained a state in which the film forming can be performed by sputtering the target. Thereafter, the above-mentioned operations are repeated to perform the replacement of the targets.

As described above, this invention has employed an arrangement in which: an independent reserve chamber which is separate from the vacuum chamber and which requires only the volume for replacing the target is disposed; at the time of replacing the target, only the reserve chamber is opened to the atmosphere so that the used target can be replaced for an unused target. Therefore, at the time of replacing the target, the vacuum chamber need not be returned to the atmospheric pressure. In addition, after having replaced the target, only the reserve chamber need be evacuated. As a consequence, the processing time to be interrupted by the work of target replacement can be reduced to the extent possible.

In this invention, preferably the rotary shaft body is provided with two target holders in a manner to be elongated respectively in opposite directions on the same line. According to this arrangement, after having replaced the target, the open-close door is closed and when the reserve chamber is evacuated to a predetermined pressure, thereby reaching a predetermined pressure, only by moving the movable base closer to the vacuum chamber, there can be attained a state in which film-forming can be performed by sputtering the target. Further, the target that is to be used next can advantageously be constantly stored in the vacuum atmosphere.

Further, this invention may employ an arrangement in which the target holder contains therein: a magnet unit which causes a leakage magnetic field to function on a surface of the target; and drive means for driving to rotate the magnet unit about the Z axis.

MODES FOR CARRYING OUT THE INVENTION

Hereinafter, with reference to the drawings, a description will be made of an embodiment of a cathode unit for a sputtering apparatus according to this invention, which is adapted to be used in the sputtering apparatus for forming a predetermined thin film on the surface of a substrate. Descriptions will hereinafter be made on the basis: that the posture as shown in FIG. 1 is defined to be a standard posture; that a rotary shaft body, which will be described in detail hereinafter, is supposed to be disposed to extend in a horizontal direction (right-and-left direction in FIG. 1) which is parallel with a sputtering surface of an unused target, the axial direction of this rotary shaft body being defined to be an X-axis direction; that the direction of moving forward or backward the movable base (vertical direction in FIG. 1), which will be described in detail hereinafter, is defined to be a Z axis; and further that the direction about the Z-axis direction is defined to be a peripheral direction.

Figure 1:
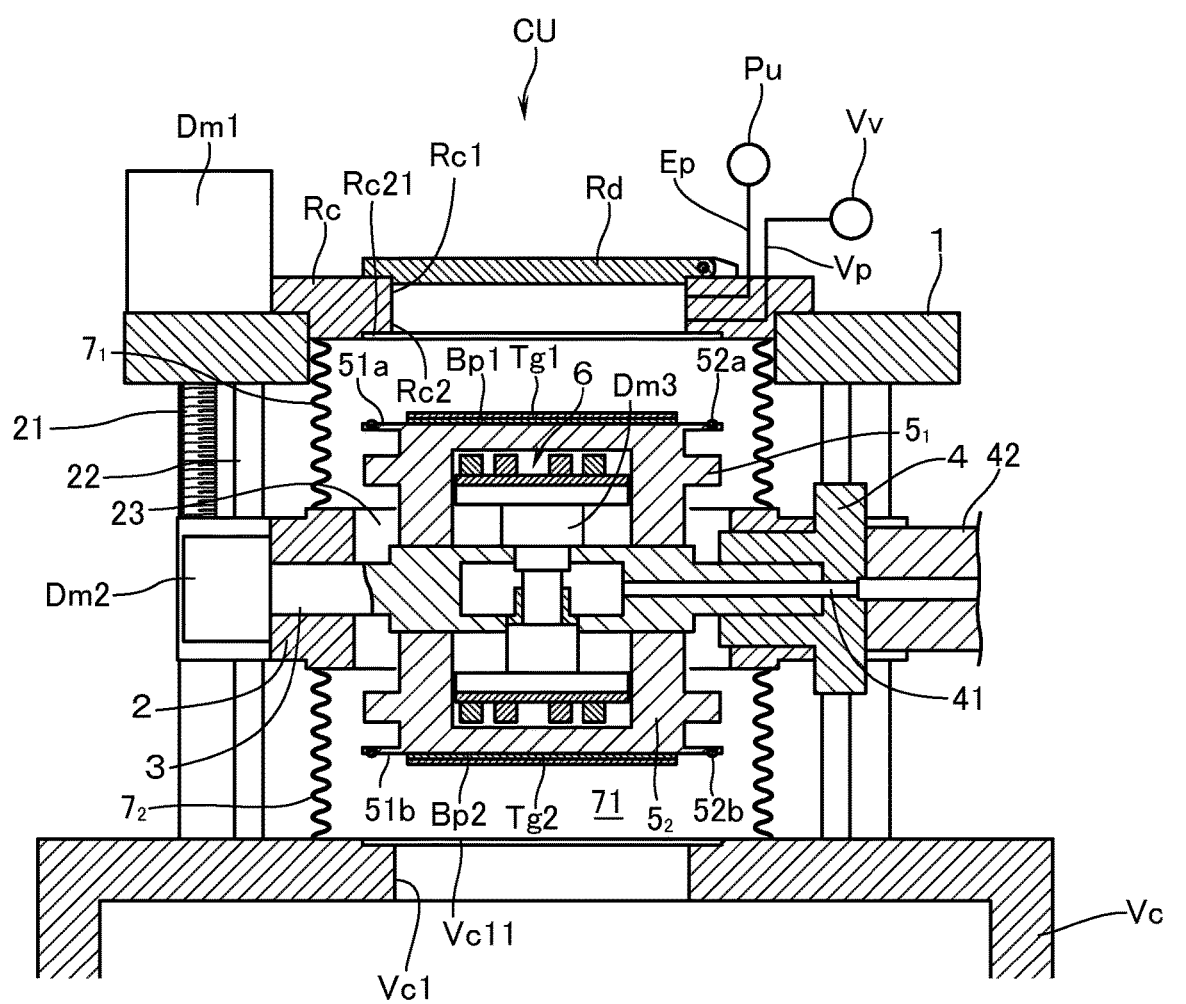
FIG. 1 is a sectional view of a cathode unit according to an embodiment of this invention, with the movable base in a neutral position.
Figure 1:

With reference to FIG. 1, reference mark Vc denotes a vacuum chamber which is capable of forming a vacuum atmosphere therein through evacuation with a vacuum pump (not illustrated), and on an upper surface, in the Z-axis direction, of the vacuum chamber there is formed a first opening Vc1 to which faces the target to be described in detail hereinafter. On an external wall surface in a position right above the first opening Vc1, there is mounted a cathode unit CU of this embodiment. By the way, since the inner structure itself of the vacuum chamber Vc for the sputtering apparatus can be made use of a known one, detailed description thereof will be omitted here.

The cathode unit CU has a supporting frame 1 of substantially annular profile, and inside the supporting frame 1 there is provided an annular movable base 2 which is capable of moving forward or backward so as to be movable closer to or away from (in the vertical direction) the vacuum chamber Vc. The movable base 2 has formed, at a distance in the circumferential direction thereof, two threaded hole parts (not illustrated) which penetrate in the vertical direction. Each of the threaded hole parts has threadedly coupled thereto a feed screw 21 to which is coupled a first motor Dm1 disposed on an upper part of the supporting frame 1 (FIG. 1 shows only the feed screw 21 to be driven by the first motor Dm1 on one side). Further, the movable base 2 has formed, at a distance in the circumferential direction, four guide holes (not illustrated) penetrating the movable base 2 in the vertical direction, and each of the guide holes has inserted therethrough a guide pin 22 disposed in the supporting frame 1. In this arrangement, when the first motor Dm1 is driven for rotation in one direction, the movable base 2 is guided by the guide pins 22 to thereby move, while maintaining its posture as it is, closer to the vacuum chamber Vc. When the first motor Dm1 is driven for rotation in the opposite direction, the movable base 2 is guided by the guide pins 22 to thereby move, while maintaining its posture as it is, away from the vacuum chamber Vc.

The movable base 2 rotatably supports the rotary shaft body 3 which penetrates through the inner space 23 in the X-axis direction. In this case, one end (left end in FIG. 1) of the rotary shaft body 3 is protruded outside the movable base 2 through bearing members (not illustrated) such as magnetic bearings and the like which serve the dual function of vacuum seals. One end of this protruded rotary shaft body 3 is coupled to a second motor Dm2. The other end (right end in FIG. 1) in the X-axis direction of the rotary shaft body 3 is provided with a bearing member 4 which serves the dual function of a vacuum seal, the bearing member 4 being disposed on a side wall in the X-axis direction of the movable base 2. In this embodiment, the second motor Dm2 and the bearing member 4 constitute a rotary mechanism which causes the rotary shaft body 3 to rotate about the X-axis. Then, when the second motor Dm2 is driven for rotation, the rotary shaft body 3 is rotated about the X axis. Inside the bearing member 4 there is formed a fluid passage 41 for circulating the cooling water to a backing plate which is described in detail hereinafter. It is thus so arranged that the target, which is described hereinafter, can be cooled during sputtering. In FIG. 1, reference mark 42 denotes an adapter for connecting a water pipe from a water flow pump (not illustrated). Although not described with illustration, the rotary shaft body 3 has connected thereto an output cable from a sputtering power source so that, at the time of sputtering, a predetermined power supply having, e.g., a negative electric potential can be charged to the target.

On an outer peripheral portion of the rotary shaft body 3 which is positioned in the inner space 23 of the movable base 2, there are disposed in an erected manner two cylindrical target holders $5_1$, $5_2$ in a phase deviation of 180° (i.e., in a manner to be elongated in opposite directions on the same line). Then, targets Tg1, Tg2 with a circular profile are detachably mounted on a tip surface of the target holders $5_1$, $5_2$ with a circular profile through backing plates Bp1, Bp2. As the targets Tg1, Tg2, use may be made of ones manufactured in the known methods depending on the compositions of the thin film to be formed on the substrate. In this embodiment, targets Tg1, Tg2 of the same composition are used. In addition, the inside space of the target holders $5_1$, $5_2$ is provided with: magnet units 6 which cause to function leakage magnetic fields on the surfaces of the targets Tg1, Tg2, respectively; and a third motor Dm3 which drives to rotate the magnet units 6 about the Z axis. By the way, since the magnet units 6 themselves may be made use of the known ones, detailed description will be omitted here.

In that portion of the supporting frame 1 which is away in the Z-axis direction from the vacuum chamber Vc, there is provided a reserve chamber Rc which has been left open on an upper surface thereof. On an upper surface of the reserve chamber Rc, there is provided an open/close door Rd which blocks an upper surface opening Rc1 in a manner to freely open or close the opening. In addition, on a lower surface of the reserve chamber Rc there is formed a second opening Rc2 in a manner to lie opposite to the first opening Vc1 of the vacuum chamber Vc and also in a manner that the second opening Rc2, to which the targets Tg1, Tg2 face, has the same opening diameter as that of the first opening Vc1. In this case, on the peripheral portions of the first opening Vc1 and the second opening Rc2, there are respectively formed annular recessed fitting parts Vc11, Rc21 which recess in the Z-axis direction. It is thus so arranged that, when the movable base 2 is moved in a direction toward or away from the vacuum chamber, the flange parts 51a, 51b formed at the tip surfaces of the target holders $5_1$, $5_2$ get closely fitted into contact with the recessed fitting parts Vc11, Rc21 through O-rings 52a, 52b, whereby the vacuum chamber Vc or the reserve chamber Rc gets isolated. In this case, the flange parts 51a, 51b provided with the O-rings 52a, 52b constitute the isolating part in this embodiment.

The volume of the reserve chamber Rc is set small to the extent possible taking into consideration the work of replacing the targets Tg1, Tg2. Further, the reserve chamber Vc has connected thereto an exhaust pipe Ep which is in communication with the vacuum pump Pu, and a vent pipe Vp which is in communication with a vent valve Vv. As the vacuum pump Pu use may be made of an exclusively-used one which is capable of independently evacuating the reserve chamber Rc as shown in FIG. 1. Alternatively, connection may be made through a change-over valve to a vacuum pump (not illustrated) which evacuates the vacuum chamber Vc. In addition, between the movable base 2 and the reserve chamber Rc, as well as between the movable base 2 and the vacuum chamber Vc, there are disposed a pair of upper and lower vacuum bellows $7_1$, $7_2$ which enclose the space 61 in which the target holders $5_1$, $5_2$ are disposed. In a neutral position, which is described in detail hereinafter, of the movable base 2, it is so arranged that the reserve chamber Rc and the vacuum chamber Vc can be brought into communication with each other in the vacuum atmosphere through the inner space 71 of the pair of upper and lower vacuum bellows $7_1$, $7_2$ inclusive of the inner space 23 of the movable base 2. Hereinafter with reference also to FIG. 2 and FIG. 3, description will be made in concrete of an example of using the above-mentioned cathode unit CU, inclusive of the method of replacing the target.

Prior to mounting the cathode unit CU on the vacuum chamber Vc, the targets Tg1, Tg2 coupled to the backing plates Bp are respectively mounted on the tip surfaces of the target holders $5_1$, $5_2$. Then, a posture is attained in which both the target holders $5_1$, $5_2$ are positioned on the Z axis and in which one Tg1 of the targets faces the reserve chamber Rc and the other Tg2 of the targets faces the vacuum chamber Vc. In this state the cathode unit CU is mounted, through the supporting frame 1, on a predetermined position of the external wall surface of the vacuum chamber Vc (the state as shown in FIG. 1). In this case, the movable base 2 is positioned such that the flange parts 51a, 51b of the target holders $5_1$, $5_2$ are respectively away from the first opening Vc1 and the second opening Vc2 (this state is called the neutral position of the movable base 2). Further, the open-close door Rd of the reserve chamber Rc is kept closed, and the vacuum chamber Vc and the reserve chamber Rc are in the atmospheric state. Once the cathode unit CU has been mounted, a vacuum pump (not illustrated) and a vacuum pump Pu for the reserve chamber Rc are respectively operated to thereby evacuate the vacuum chamber Vc and the reserve chamber Rc. At this time, the inner space 71 between the pair of the upper and the lower vacuum bellows $7_1$, $7_2$ inclusive of the inner space 23 of the movable base 2 are also evacuated.

Figure 2:
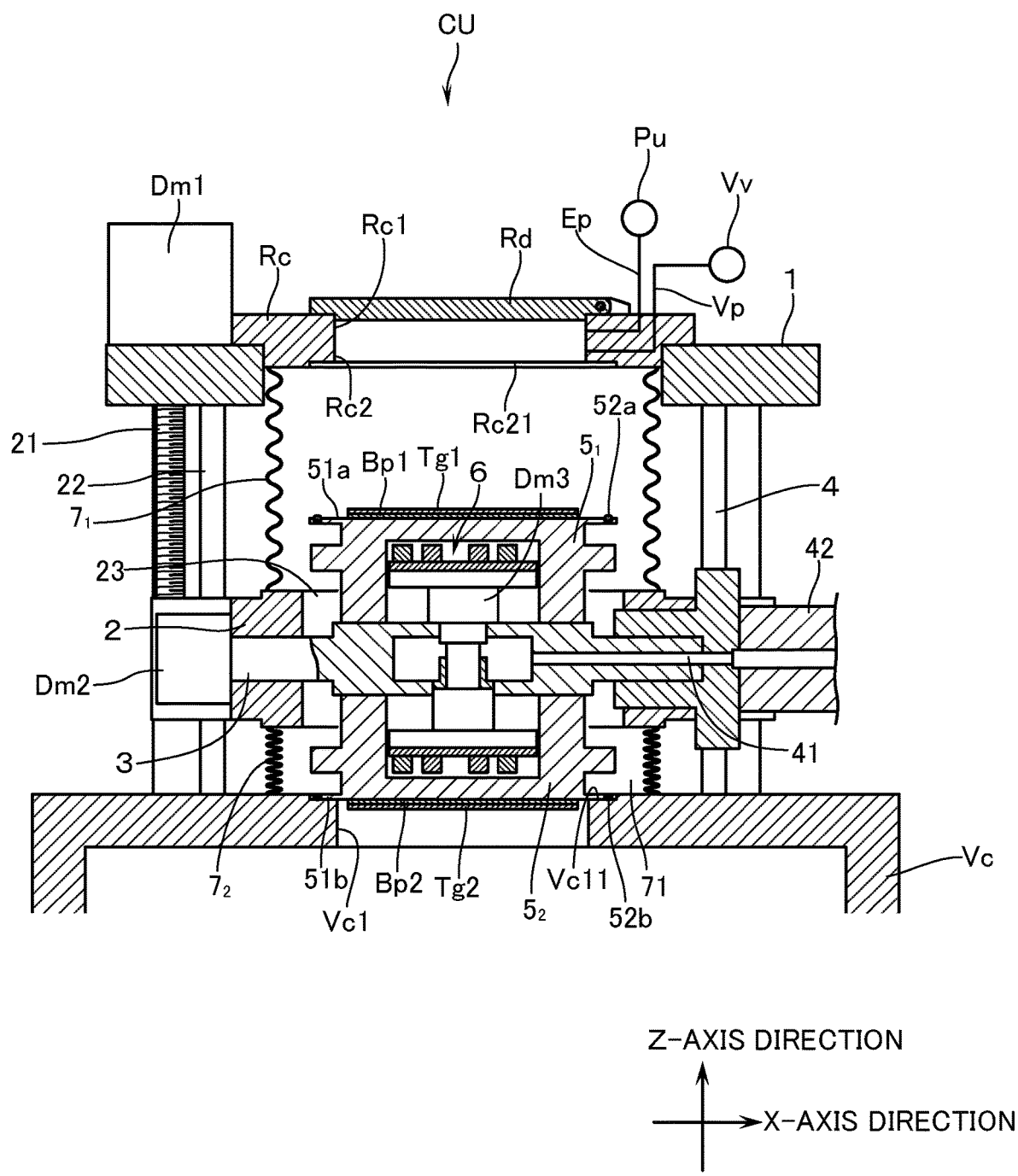
FIG. 2 is a sectional view of the cathode unit according to an embodiment of this invention, with the movable base in a film-forming position.

When the vacuum chamber Vc and the reserve chamber Rc have been evacuated down to a predetermined pressure (e.g., $1 \times 10^{-5}$ Pa), the movable base 2 is moved closer to the vacuum chamber Vc (in FIG. 1, to be moved downward). Then, the flange part 51b formed on the tip end of the other $5_2$ of the target holders will be closely fitted into the recessed fitting part Vc11 through the O-ring 52b. As a result, as shown in FIG. 2, in a state in which the target Tg2 mounted on the other $5_2$ of the target holders faces the inside of the vacuum chamber Vc, the vacuum chamber Vc will be isolated out of communication with the inner space 71 of the vacuum bellows $7_1$, $7_2$ (this state is called the film-forming position of the movable base 2). In the film-forming position, by sputtering the target Tg2, film-forming is performed on a substrate (not illustrated) disposed to lie opposite to the target Tg2. By the way, while the other Tg2 of the targets is being sputtered, the non-used target Tg1 mounted on the one target holder $5_1$ is stored in the inner space 71 of the vacuum bellows $7_1$, $7_2$ in vacuum atmosphere, to the advantage in that, e.g., sufficient degassing can be performed. When the target Tg2 has been eroded to a predetermined amount, this target Tg2 will be replaced.

Figure 3:
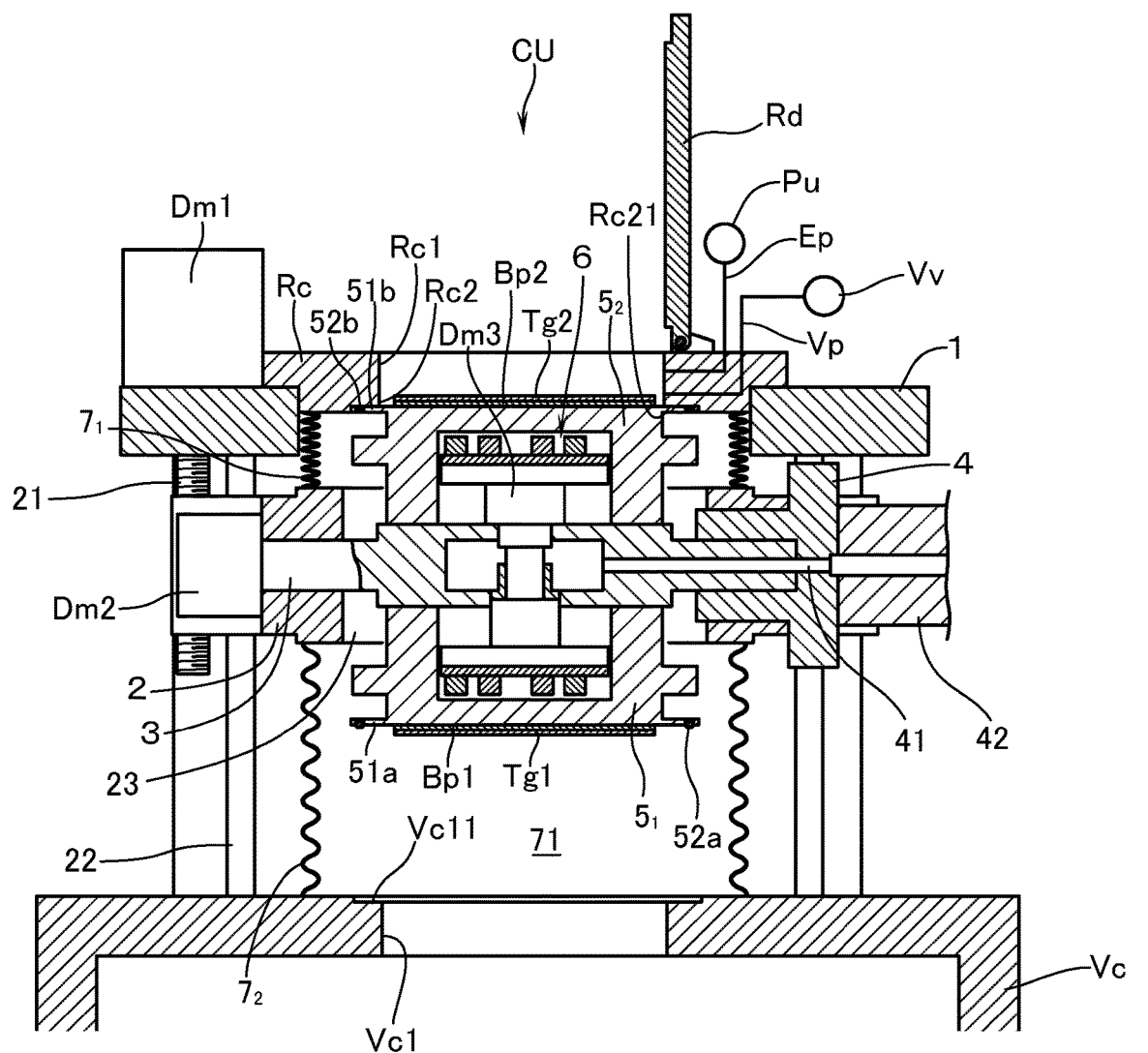
FIG. 3 is a sectional view of the cathode unit according to an embodiment of this invention, with the movable base in a replacing position.

In replacing the targets, after having returned the movable base 2 to the neutral position, the rotary shaft body 3 is rotated by the second motor Dm2 by 180° about the X axis. Then, the used target Tg2 mounted on the other $5_2$ of the target holders will be in a posture to lie opposite to the reserve chamber Rc, and the unused target Tg1 mounted on the one target holder $5_1$ will be in a posture to lie opposite to the vacuum chamber Rc. Then, the movable base 2 is moved away from the vacuum chamber Vc in the Z-axis direction (moved upward in FIG. 1). Then, the flange part 51b formed at the tip surface of the other $5_2$ of the target holders will get fitted into the recessed fitting part Rc21 through the O-ring 52b. According to this arrangement, as shown in FIG. 3, the target Tg2 mounted on the other $5_2$ of the target holders will be in a state to lie opposite to the inside of the reserve chamber Rc, and the reserve chamber Rc will be isolated out of communication with the inner space 71 of the vacuum bellows $7_1$, $7_2$ (this is called the replacing position of the movable base 2).

Once the reserve chamber Rc has been isolated, the vent valve Vv is operated to introduce into the reserve chamber Rc nitrogen gas, air, and the like into the reserve chamber Rc, thereby returning the reserve chamber Rc back to the atmospheric pressure. Once the reserve chamber Rc has been returned to the atmospheric pressure, the open-close door Rd is opened to thereby perform the replacement work of the used target Tg2 mounted on the other $5_2$ of the target holders. By the way, during the above-mentioned work, the unused target Tg1 mounted on the one $5_1$ of target holders remains stored in the vacuum atmosphere.

After replacement of the targets, the open-close door Rd is closed, and thereafter the reserve chamber Vc is evacuated by the vacuum pump Pu down to a predetermined pressure (e.g., $1 \times 10^{-5}$ Pa). Once the reserve chamber Rc has reached the predetermined pressure, the movable base 2 is moved closer to the vacuum chamber Vc down to the film-forming position. According to these operations, in a state in which the unused target Tg1 mounted on the one $5_1$ of the target holders faces the inside of the vacuum chamber Vc, the vacuum chamber Vc will be isolated out of communication with the inner space 71 of the vacuum bellows $7_1$, $7_2$. Thereafter, the above-mentioned operations are repeated to thereby perform the replacement work of the targets Tg1 and Tg2.

As explained so far, according to this embodiment, the following arrangement has been employed, i.e.: there is disposed the reserve chamber Rc that may have a volume required only for replacing the targets and that is separate from the vacuum chamber Vc; and, at the time of replacing the targets, only the reserve chamber Rc is returned to the atmospheric pressure so that the used target Tg2 is replaced by a non-used one Tg1. Therefore, at the time of replacing the targets, the vacuum chamber Vc need not be opened to the atmosphere and, after having replaced the targets, only the reserve chamber Rc need be evacuated. Therefore, the treatment time to be interrupted for replacing the targets can be reduced to the extent possible. Furthermore, the two pieces of target holders $5_1$, $5_2$ are disposed in a manner to protrude on the same line but in directions opposite to each other. Therefore, after having replaced the targets, the open-close door Rd is closed, and the reserve chamber Rc is evacuated down to the predetermined pressure. Once the reserve chamber Rc has reached the predetermined pressure, only by moving the movable base 2 closer to the vacuum chamber, there can be attained a state in which film forming can be performed by sputtering the target Tg1 (Tg2). In addition, the target Tg1 (Tg2) to be used next time can always be kept advantageously in a vacuum atmosphere.

Descriptions have so far been made of the embodiment of this invention, but this invention shall not be limited to the above, but may be modified within a scope of the technical idea of this invention. In the above-mentioned embodiment, descriptions were made of an example of using two pieces of targets Tg1, Tg2, but this invention shall not be limited to the above. This invention can be applied to an example in which a single target holder is disposed on the rotary shaft body 3 and in which a target is mounted thereon.

Further, in the above-mentioned embodiment, descriptions were made of an example in which the targets Tg1, Tg2 of the same composition are mounted on the tip surface of the target holders $5_1$, $5_2$. This invention, however, shall not be limited to the above, but targets of different compositions may also be mounted. In this kind of case, by appropriately performing the movement of the movable base 2 between the neutral position and the film-forming position and by appropriately performing the rotation of the rotary shaft body 3, different thin films can alternately be formed on the surface of the substrate. Still furthermore, it is also possible to provide the rotary shaft body 3 with three or more pieces of target holders, and the target to be mounted on each of the target holders is made of different compositions. Then, multi-layer films can also be formed on the surface of the substrate.

EXPLANATION OF REFERENCE CHARACTERS

CU cathode unit
Dm2 second motor (rotary mechanism)
Dm3 third motor (drive means)
Rc reserve chamber Rc2 second opening
Rd open/close door
Vc vacuum chamber
Vc1 first opening
Vv vent valve
1 supporting frame
2 movable base
3 rotary shaft body
$5_1$, $5_2$ target holder
51a, 51b flange part (isolating part)
52a, 52b O-ring (isolating part)
6 magnet unit
$7_1$, $7_2$ vacuum bellow

The invention claimed is:

1. A cathode unit for use in a sputtering apparatus, the cathode unit having a target and being adapted to be mounted on a vacuum chamber, the cathode unit comprising:

a supporting frame mounted on an external wall of the vacuum chamber;

an annular moveable base supported by the supporting frame in a manner to be moveable toward or away from the vacuum chamber;

a rotary shaft body rotatably supported by the annular movable base in a manner to be elongated through an inner space of the annular movable base in parallel with a sputtering surface of the target;

provided an axial direction of the rotary shaft body is defined to be an X-axis direction, and a forward or backward direction of the annular movable base orthogonal to the X-axis direction is defined to be a Z-axis direction, at least one target holder disposed on the rotary shaft body in a manner to be radially protruded such that the target is detachably mounted in position on a top surface of the at least one target holder;

a reserve chamber disposed in that portion of the supporting frame which is away by a predetermined distance in the Z-axis direction from an external wall surface of the vacuum chamber, the reserve chamber having an open-close door and being capable of evacuation independent of the vacuum chamber;

a pair of vacuum bellows disposed between the annular movable base and the reserve chamber, and between the annular movable base and the vacuum chamber so as to enclose the at least one target holder;

wherein the at least one target holder is provided with an isolating part configured to come into contact with a peripheral part of a first opening formed in the vacuum chamber such that the vacuum chamber in which the target is present is isolated in a film-forming position of the annular movable base in which the at least one target holder is positioned on the Z axis and the target has been moved in the Z-axis direction closer to the vacuum chamber in a posture to face the vacuum chamber side, the at least one target holder being provided with the isolating part is configured to come into contact with a peripheral part of a second opening formed in the reserve chamber in a replacing position of the annular movable base in which the target has been moved in the Z-axis direction away from the vacuum chamber in a posture to face the reserve chamber side; and wherein the isolating part is further provided with a rotary mechanism for rotating the rotary shaft body about the X axis in a neutral position of the annular movable base in which the isolating part is away from the first opening and the second opening.

2. The cathode unit for use in a sputtering apparatus according to claim 1, wherein the rotary shaft body provided with the at least one target holder has two target holders elongated respectively in opposite directions on a same line.

3. The cathode unit for use in a sputtering apparatus according to claim 1, wherein the at least one target holder contains therein: a magnet unit which causes a leakage magnetic field to function on a surface of the target; and drive means for driving to rotate the magnet unit about the Z axis.

4. The cathode unit for use in a sputtering apparatus according to claim 2, wherein the two target holders, each holder having a corresponding target, contain therein: a magnet unit which causes a leakage magnetic field to function on a surface of the corresponding target; and drive means for driving to rotate the magnet unit about the Z axis.

* * * * *